(12) United States Patent
Takeuchi et al.

(10) Patent No.: US 8,632,202 B2
(45) Date of Patent: Jan. 21, 2014

(54) WHITE LED, BACKLIGHT USING SAME, AND LIQUID CRYSTAL DISPLAY DEVICE CONFORMING TO EBU STANDARD

(75) Inventors: Hajime Takeuchi, Yokohama (JP); Ryo Sakai, Yokohama (JP); Tsutomu Ishii, Yokohama (JP); Yasumasa Ooya, Chigasaki (JP); Yasuhiro Shirakawa, Yokohama (JP)

(73) Assignees: Kabushiki Kaisha Toshiba, Tokyo (JP); Toshiba Materials Co., Ltd., Yokohama-shi (JP)

( * ) Notice: Subject to any disclaimer, the term of this patent is extended or adjusted under 35 U.S.C. 154(b) by 0 days.

(21) Appl. No.: 13/229,040

(22) Filed: Sep. 9, 2011

(65) Prior Publication Data

US 2012/0062821 A1 Mar. 15, 2012

Related U.S. Application Data

(63) Continuation of application No. PCT/JP2010/001554, filed on Mar. 5, 2010.

(30) Foreign Application Priority Data

Mar. 10, 2009 (JP) ................................. 2009-056556

(51) Int. Cl.
*G09F 13/08* (2006.01)
(52) U.S. Cl.
USPC ........................................................ 362/97.3
(58) Field of Classification Search
USPC ........................................................ 362/97.3
See application file for complete search history.

(56) References Cited

U.S. PATENT DOCUMENTS

| 7,961,762 B2 | 6/2011 | Ishii et al. |
| 8,451,401 B2 | 5/2013 | Kawana et al. |
| 2008/0265742 A1 | 10/2008 | Yokosawa et al. |
| 2010/0142189 A1* | 6/2010 | Hong et al. ................. 362/97.3 |
| 2010/0322275 A1* | 12/2010 | Ishii et al. ................. 372/43.01 |

FOREIGN PATENT DOCUMENTS

| JP | 2007-096133 A | 4/2007 |
| JP | 2007-312374 | 11/2007 |
| JP | 2008-034188 A | 2/2008 |

(Continued)

OTHER PUBLICATIONS

International Search Report issued May 18, 2010 in PCT/JP2010/001554 filed Mar. 5, 2010 (with English Translation).

(Continued)

*Primary Examiner* — Anh Mai
*Assistant Examiner* — Michael Santonocito
(74) *Attorney, Agent, or Firm* — Oblon, Spivak, McClelland, Maier & Neustadt, L.L.P.

(57) ABSTRACT

In a embodiment, a white LED for a backlight of a liquid crystal display device conforming to the EBU standard includes an ultraviolet (purple) light-emitting element, and a phosphor layer which contains 1 to 10 wt % of a green phosphor including a divalent europium-activated silicate phosphor, 40 to 80 wt % of a blue phosphor including at least one selected from a divalent europium-activated halo-phosphate phosphor and a divalent europium-activated aluminate phosphor, and 10 to 50 wt % of a red phosphor including at least one selected from a europium-activated lanthanum oxysulfide phosphor and a europium-activated yttrium oxysulfide phosphor.

9 Claims, 2 Drawing Sheets

(56) References Cited

FOREIGN PATENT DOCUMENTS

| KR | 10-2009-0096543 | | 9/2009 |
|----|----|----|----|
| TW | 200609342 | | 3/2006 |
| TW | 200849669 | | 12/2008 |
| WO | WO 2008/096545 A1 | | 8/2008 |
| WO | WO 2008096545 A1 | * | 8/2008 |
| WO | WO 2009099211 A1 | * | 8/2009 |

OTHER PUBLICATIONS

Office Action issued May 24, 2013, in Taiwan Patent Application No. 099106766.

Office Action issued Mar. 26, 2013, in Japanese Patent Application No. 2011-503678 (with English-language Translation).

Written Opinion issued May 18, 2010 in PCT/JP2010/001554 filed Mar. 5, 2010.

* cited by examiner

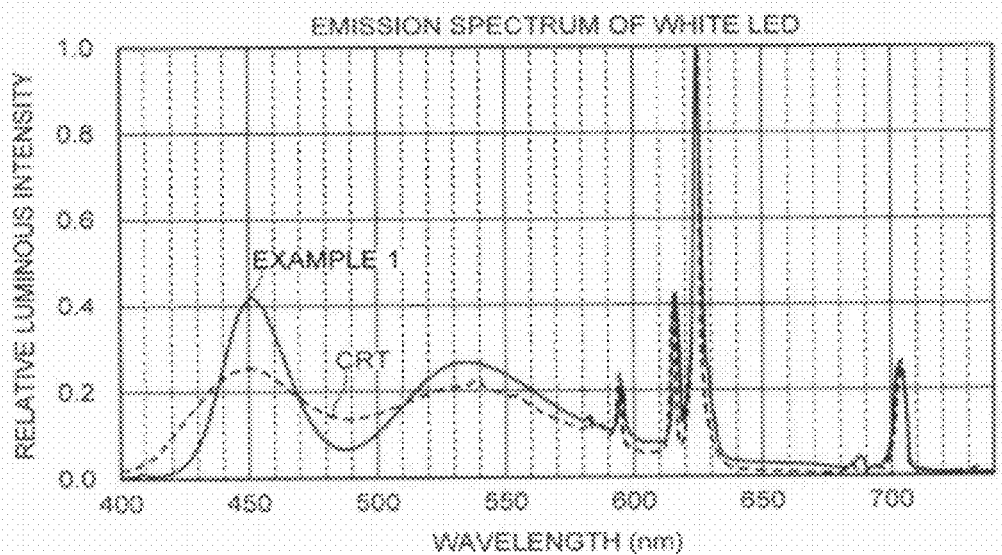
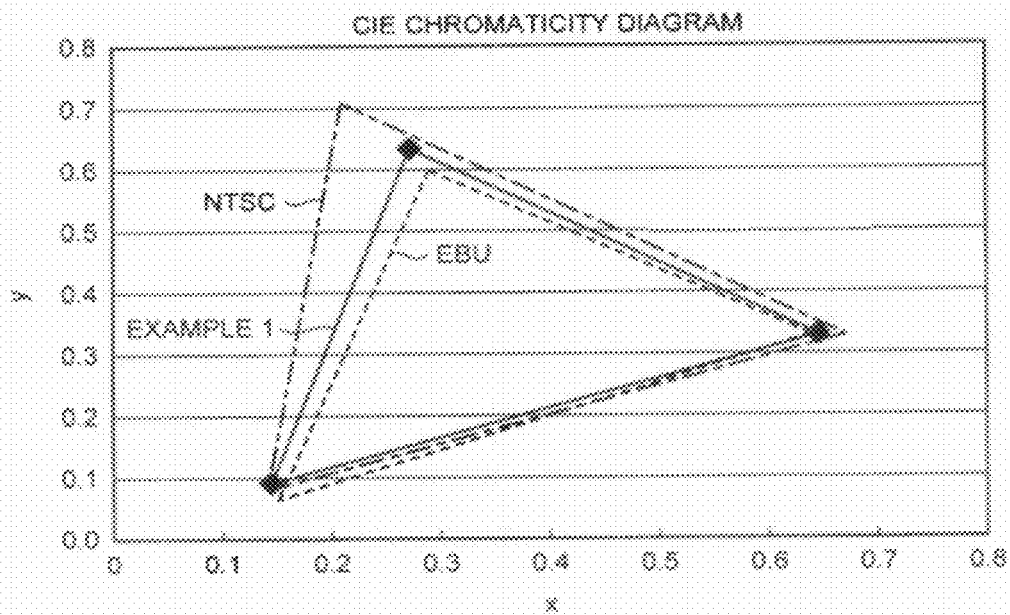

WHITE LED, BACKLIGHT USING SAME, AND LIQUID CRYSTAL DISPLAY DEVICE CONFORMING TO EBU STANDARD

CROSS-REFERENCE TO RELATED APPLICATIONS

This application is a continuation of prior International Application No. PCT/JP2010/001554, filed on Mar. 5, 2010 which is based upon and claims the benefit of priority from Japanese Patent Application No. 2009-056556, filed on Mar. 10, 2009; the entire contents of all of which are incorporated herein by reference.

FIELD

Embodiments described herein relate generally to a white LED, a backlight using the same, and a liquid crystal display device conforming to the EBU standard.

BACKGROUND

The liquid crystal display is used increasingly for television, PC, etc. in ordinary homes. A Braun tube (CRT: cathode ray tube) display which provides high-definition images is still used in many situations in the fields where the image quality is valued for monitors typically used as the master monitors in broadcasting stations and the monitors used at video creation spots. Even in the same field, it is considered to use a liquid crystal display or a PDP (Plasma Display Panel) instead of the CRT display, but the image quality of the liquid crystal display or the PDP is not satisfactory yet in comparison with that of the CRT display although the improvement of the image quality is underway. In view of the above circumstances, an image display device other than the CRT display has not been used positively in the above-described fields of broadcasting and the like.

The broadcasting color CRT reproduces the shape, movement and color phase of an image subject on an image-receiving screen through imaging (color camera), transmitting and image-receiving processes. Therefore, a method of transmitting an image signal including the color phase is standardized. Typical ones of the standards are the standard defined by NTSC (National Television System Committee), and the standard defined by EBU (European Broadcasting Union).

The EBU standard equivalent to 72% of the NTSC (international standard showing an ideal color reproduction range) which can be displayed by the CRT is used as a standard in the broadcasting and other fields and being still in use. Accordingly, it is now being attempted to obtain the same image quality as that of the CRT display by designing the liquid crystal display device so as to conform to the EBU standard being used in the fields of broadcasting and the like. And developments have been made on color filters, backlights and the like having good color reproducibility conforming to the EBU standard to realize the above.

The color reproducibility of the liquid crystal display device is determined by a combination of the backlight and the color filter. Several color filters have been developed to obtain color reproducibility conforming to the EBU standard, but no backlight for the liquid crystal display device has been obtained to realize the color reproducibility conforming to the EBU standard by combining with the above color filters.

BRIEF DESCRIPTION OF THE DRAWINGS

FIG. 2 is a diagram showing an example of emission spectrum of the white LED in the embodiment.

FIG. 3 is a diagram showing an example of color reproducibility when the white LED of the embodiment is used as a backlight of a liquid crystal display device.

DETAILED DESCRIPTION

Figure 1:
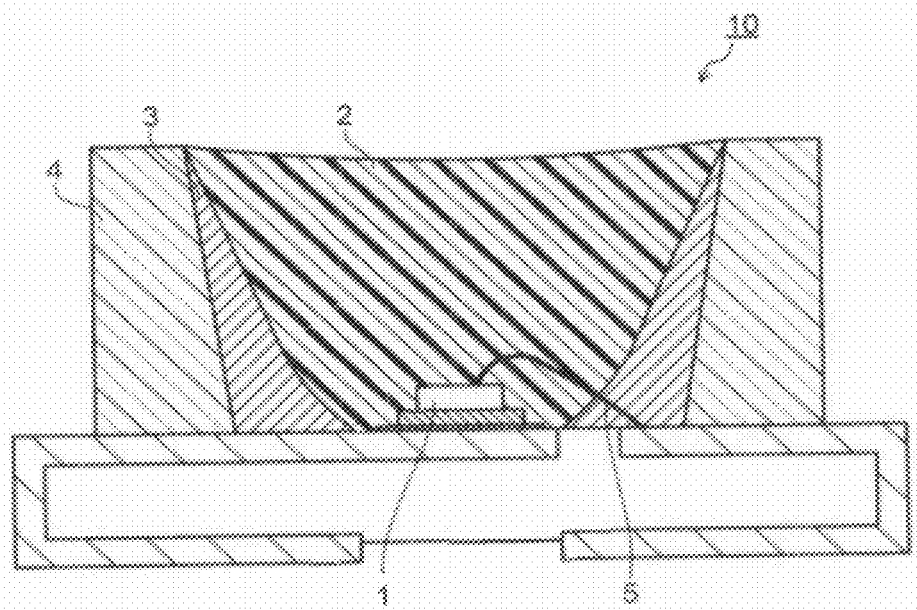
FIG. 1 is a sectional view showing an example of a white LED in an embodiment.

In an embodiment, a white LED for a backlight of a liquid crystal display device conforming to the EBU standard is provided with a light-emitting element including at least one selected from an ultraviolet light-emitting diode, a purple light-emitting diode, an ultraviolet-emitting laser and a purple light-emitting laser, and a phosphor layer. In the white LED, an emission spectrum has a first light emission peak group composed of at least one light emission peak having a maximum intensity in a range of 430 to 470 nm, a second light emission peak group composed of at least one light emission peak having a maximum intensity in a range of 520 to 560 nm, a third light emission peak group having two or more linear light emission peaks in a range of 580 to 740 nm, and a valley which is between the first light emission peak group and the second light emission peak group and has a minimum intensity in a range of 480 to 500 nm. When the first light emission peak group is determined to have a maximum intensity P1 of 1.0, a maximum intensity P2 of the second light emission peak group is $0.15 \leq P2 \leq 1.0$, a maximum intensity P3 of the third light emission peak group is $0.21 \leq P3 \leq 3.0$, and a minimum intensity V1 of the valley is $0.01 \leq V1 \leq 0.6$, and an intensity of 600 nm is 50% or less of the maximum intensity P3 of the third light emission peak group.

The white LED is suitable for a backlight of a liquid crystal display device conforming to the EBU standard, and the backlight is suitable for the liquid crystal display device conforming to the EBU standard.

In the specification, "the liquid crystal display device conforming to the EBU standard" means a liquid crystal display device produced in conformity with the EBU standard, which indicates color reproduction with substantially an NTSC ratio of 70 or more and does not necessarily indicate only a liquid crystal display device 100% conforming to the EBU standard. It is used as the generic name for the liquid crystal display devices including a liquid crystal display device conforming at an appropriate level to the EBU standard.

FIG. 1 is a sectional view showing an example of the white LED. In FIG. 1, 1 denotes a light-emitting diode, 2 denotes a phosphor layer which has a phosphor buried in a resin, 3 denotes a reflection layer which leads the light emitted from the light-emitting diode and the phosphor to outside, and 4 denotes a resin frame which supports the light-emitting portion. It is configured that electric energy applied to an LED lamp through a wiring 5 is converted into ultraviolet light or purple light by the light-emitting diode, such light is converted into light of a longer wavelength by the phosphor layer which is on the light-emitting diode, and white light is externally emitted from an LED lamp (white LED) 10.

As the ultraviolet light-emitting diode or the purple light-emitting diode, various light emitting diodes such as InGaN type, GaN type, AlGaN type and the like can be applied. In a case where a light emission wavelength of the light emitting diode has a peak value in a wavelength range of 360 to 430 nm, it becomes possible to configure a white LED which exhibits high brightness and superior color reproducibility by combining with a phosphor described later. It is preferable that the light emission wavelength of the ultraviolet light-emitting diode or the purple light-emitting diode has a peak value of 360 to 430 nm because higher brightness can be obtained when the light-emitting diode is combined with the phosphor described later. The ultraviolet-emitting laser or the purple light-emitting laser may be used instead of the ultraviolet light-emitting diode or the purple light-emitting diode. The ultraviolet light-emitting diode, the purple light-emitting diode, the ultraviolet-emitting laser and the purple light-emitting laser are collectively called as the light-emitting element.

The phosphor to be used for the phosphor layer 2 is not limited to a particular one if it is a phosphor capable of exhibiting the light emission peaks given below when the white LED is formed, but it is important to use a visible light emitting phosphor. As the visible light emitting phosphor, it is preferable to use at least one green phosphor, at least one blue phosphor and at least one red phosphor. FIG. 2 shows an emission spectrum (specifically, an emission spectrum of the white LED obtained by the following Example 1) of the embodiment of the white LED together with an emission spectrum of a white display state of a typical CRT RDS-15X (manufactured by Mitsubishi Electric Corporation) conforming to the EBU standard.

A first light emission peak group includes at least one light emission peak having the maximum intensity in a range of 430 to 470 nm, a second light emission peak group includes at least one light emission peak having the maximum intensity in a range of 520 to 560 nm, and a third light emission peak group includes two or more linear light emission peaks in a range of 580 to 740 nm.

The light emission peak wavelengths of the individual light emission peak groups including the plural light emission peaks appearing on the emission spectrum are specified as described above. In short, the individual light emission peak groups are appropriate when they include the wavelength indicating the maximum intensity of the light emission peak group in the above-described ranges, and it is not necessary to have all the light emission peak groups in the above ranges.

The individual light emission peak groups have characteristics as described below. The first light emission peak group exhibits the light emission peak having the maximum intensity in a range of 430 to 470 nm. This wavelength is preferably in a range of 430 to 460 nm. The light emission peaks configuring the light emission peak group may be plural but preferably be single. The first light emission peak group of the emission spectrum of the white LED of the embodiment shown in FIG. 2 includes one light emission peak of which peak wavelength is 452 nm.

The second light emission peak group exhibits the light emission peak having the maximum intensity in a range of 520 to 560 nm. This wavelength is more preferably in a range of 520 to 555 nm. The light emission peaks configuring the light emission peak group may be plural but preferably be single. When it is checked in the emission spectrum of FIG. 2, the second light emission peak group includes one light emission peak, and its peak wavelength is 534 nm. The second light emission peak preferably has a full width at half maximum in a range of 50 to 200 nm.

As to the third light emission peak group having two or more linear light emission peaks in a range of 580 to 740 m, it is more preferably in a range of 590 to 710 nm. It is preferable that at least one of the linear light emission peaks is exhibited in a range of 620 to 630 nm and another one in a range of 700 to 710 nm, because deep red can be exhibited. On the emission spectrum of the white LED of the embodiment shown in FIG. 2, the third light emission peak group has four main linear light emission peaks, and their peak wavelengths are 595 nm, 616 nm, 625 nm and 704 nm. The linear light emission peak denotes a light emission peak having a full width at half maximum of 5 nm or less.

The white LED of the embodiment does not conform to the EBU standard if the individual light emission peak groups do not exhibit in the above-described wavelength range, because a difference from the emission spectrum of the CRT becomes large when the white LED is used as the backlight of the liquid crystal display device.

Various phosphors usable in order to exhibit the above-described light emission peaks are described below.

As the green phosphor, it is preferable that a divalent europium-activated silicate phosphor represented by the following general formula 1 can be used. The phosphor represented by the general formula 1 is occasionally expressed as a green phosphor or a yellow phosphor depending on x, y, z and u in the formula, it is determined in the specification that the phosphor represented by the general formula 1 is called as the green phosphor comprehensively.

The embodiment can use as the green phosphor the above-described phosphors solely or as a mixture.

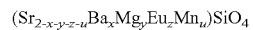

$(Sr_{2-x-y-z-u}Ba_xMg_yEu_zMn_u)SiO_4$      General formula 1:

where, x, y, z and u are numerals satisfying $0.1<x<1.0$, $y<0.21$, $0.05<z<0.3$ and $0\leq u<0.04$.

When x and u in the general formula 1 are in the above-described range, the wavelength of the light from a green phosphor powder falls in a range suitable for the white LED. It is preferable when y in the general formula 1 is in the above range because solid solution of Mn is formed adequately in the green phosphor powder. It is preferable when z in the general formula 1 is in the above-described range because the green phosphor powder is provided with high luminous efficiency. Addition of Mn increases the emission of a red portion based on Mn, and a more desirable emission spectrum can be obtained with good color reproduction as a whole. When the phosphor represented by the general formula 1 is used as a green light-emitting phosphor, Mn is not essentially required to be added and the addition of Mg can also be omitted, so that it becomes that u=0 and y=0.

As the green phosphor, a divalent europium and manganese-activated silicate phosphor substantially represented by the following general formula 1a can be used more preferably.

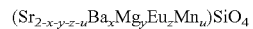

$(Sr_{2-x-y-z-u}Ba_xMg_yEu_zMn_u)SiO_4$      General formula 1a:

where, x, y, z and u are values satisfying $0.1<x<1.0$, $0.005<y<0.21$, $0.05<z<0.3$ and $0.001<u<0.04$.

The blue phosphor is described below. As the blue phosphor, it is preferable to use a divalent europium-activated halo-phosphate phosphor represented by the following general formula 2 and a divalent europium-activated aluminate phosphor represented by the following general formula 3. As the blue phosphor, one phosphor or two or more of phosphors selected from the phosphor group represented by the general formula 2 and the general formula 3 can be used solely or as a mixture. The mixture of two or more may be a combination of two or more selected from the phosphor group represented by the general formula 2 or the phosphor group represented by the general formula 3, or may be a combination of two or more selected from both of the phosphor group represented by the general formula 2 and the phosphor group represented by the general formula 3.

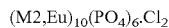

$(M2,Eu)_{10}(PO_4)_6.Cl_2$     General formula 2:

where, M2 is at least one element selected from Mg, Ca, Sr and Ba.

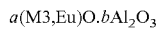

$a(M3,Eu)O.bAl_2O_3$     General formula 3:

where, M3 is at least one element selected from Mg, Ca, Sr, Ba, Zn, Li, Rb and Cs, and a and b are numerals satisfying $0<a$, $0<b$ and $0.2 \le a/b \le 1.5$.

The method of producing the blue phosphor is not particularly limited, and a compound produced by a general production method and belonging to the general formula 2 or the general formula 3 can be used. A commercially available product can also be used.

The red phosphor is described below. As the red phosphor, it is preferable to use a europium-activated lanthanum oxysulfide phosphor expressed by the general formula 4 and a europium-activated yttrium oxysulfide phosphor expressed by the general formula 5. As the red phosphor, it is possible to use one phosphor or two or more of phosphors selected from the phosphor group represented by the general formula 4 and the general formula 5 solely or as a mixture. The mixture of two or more may be a combination of two or more selected from the phosphor group represented by the general formula 4 or the phosphor group represented by the general formula 5, or may be a combination of two or more selected from both of the phosphor group represented by the general formula 4 and the phosphor group represented by the general formula 5.

$(La_{1-x1},Eu_{x1})_2O_2S$     General formula 4:

where, x1 is a value satisfying $0.01<x1<0.15$.

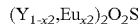

$(Y_{1-x2},Eu_{x2})_2O_2S$     General formula 5:

where, x2 is a value satisfying $0.01<x2<0.15$.

The method of producing the red phosphor is not limited to a particular one, and a compound produced by a general production method and belonging to the general formula 4 or the general formula 5 can be used. A commercially available product can also be used.

In connection with the selection of the general formula 2 or the general formula 3, and the general formula 4 or the general formula 5, it is preferable to select a phosphor depending on an excitation wavelength, brightness demands, corrosion resistance, costs, etc.

The white LED contains the above-described green phosphor, blue phosphor and red phosphor in the phosphor layer so as to exhibit the light emission peaks having above-described characteristics on the emission spectrum.

The above-described green phosphor, blue phosphor and red phosphor absorb ultraviolet rays efficiently and emit individual color lights at high efficiency when they are exposed to irradiation of ultraviolet rays (or purple light) with a wavelength of 360 to 430 nm from the light-emitting element such as the ultraviolet light-emitting diode. In other words, the green phosphor provides green light having high brightness, the blue phosphor provides blue light having high brightness, and the red phosphor provides red light having high brightness. As a result, white light having high brightness can be obtained. When obtaining the white light, if a difference in brightness of the individual colors is excessively large, for example, if only green has high brightness, it is not preferable because the obtained white becomes greenish white. In order to obtain white color having high brightness, the individual colors green (G), blue (B) and red (R) are required to have high brightness, and a combination of the individual color phosphors is important.

For example, the white LED 10 shown in FIG. 1 has a structure that electric energy applied to the light-emitting diode 1 is converted to ultraviolet light (or violet light) by the light-emitting diode, such lights are converted to light having a longer wavelength by the phosphor layer which is on the light-emitting diode, and white light is emitted out of the white LED in total. The emission spectrum obtained by measuring the light emitted from the white LED 10 by a sectrometer is shown in a shape shown in FIG. 2.

The ultraviolet light-emitting diode or the purple light-emitting diode used for the light-emitting diode 1 is indicated as a light-emitting diode, and the completed white light-emitting diode 10 is indicated as a white LED.

The light emission peaks appearing in the emission spectrum of the white LED are exhibited on the above-described wavelength, and the intensity of each light emission peak is determined that when a maximum light emission peak of the first light emission peak group exhibiting in a range of 430 to 470 nm has an intensity P1 of 1.0, a maximum intensity P2 of the second light emission peak group is expressed as $0.1 \le P2 \le 1.0$, and a maximum intensity P3 of the third light emission peak group is expressed as $0.21 \le P3 \le 3.0$. More preferably, when it is determined that the intensity P1 of the maximum light emission peak of the first light emission peak group is 1.0, the above P2 and P3 are expressed as $0.2 \le P2 \le 0.9$ and $0.3 \le P \le 2.9$.

The emission spectrum of the white LED has a valley which has a minimum intensity in a range of 480 to 500 nm and is between the first light emission peak group and the second light emission peak group. When the intensity P1 of the maximum light emission peak of the first light emission peak group is determined to be 1.0, the valley has a minimum intensity V1 satisfying $0.01 \le V1 \le 0.6$. More preferably, the minimum intensity V1 of the valley is expressed as $0.01 \le V1 \le 0.4$ when the P1 is 1.0.

In addition, the emission spectrum of the white LED has an intensity of 600 nm which is 50% or less of the maximum intensity P3 of the third light emission peak group. As a more preferable embodiment, the intensity of 600 nm is not larger than 30% of the P3.

When the maximum intensities of the individual light emission peak groups of the white LED are not in the above-described relations and the white LED is used as the backlight for the liquid crystal display device, color mixing of color filter transmitting lights becomes large, and color purity decreases. For example, if the V1 becomes large to exceed the above-described range, a green component is mixed into the blue color filter transmitting light, and a blue component is mixed into the green color filter transmitting light. It is preferable that the V1 is smaller but cannot be substantially smaller than 0.01. If the intensity of 600 nm becomes larger than the above range, the green (yellow) component is mixed into the red color filter transmitting light, and color purity decreases.

By adjusting as described above, a relation of the exhibited wavelength of the light emission peak of the emission spectrum of the white LED with the intensities of the individual light emission peaks becomes similar to the emission spectrum (emission spectrum required to secure the color reproducibility conforming to the EBU standard) in the white display state of a typical CRT RDS-15X (manufactured by Mitsubishi Electric Corporation) conforming to the EBU standard shown in FIG. 2.

The white LED can be produced by blending at an appropriate blending ratio the phosphors such as the above-described green phosphor, blue phosphor and red phosphor into the phosphor layer so that the intensity ratio of light emission peaks obtained as the emission spectrum falls in the above-described range.

Specifically, to obtain the above-described optical characteristics which are conformable to the EBU standard for the white LED, the divalent europium and manganese-activated silicate phosphor represented by the above-described general formula 1 as the green phosphor, at least one phosphor selected as the blue phosphor from the divalent europium-activated halo-phosphate phosphor represented by the above-described general formula 2 and the divalent europium-activated aluminate phosphor represented by the above-described general formula 3, and at least one phosphor selected as the red phosphor from the europium-activated lanthanum oxysulfide phosphor expressed by the above-described general formula 4 and the europium-activated yttrium oxysulfide phosphor expressed by the above-described general formula 5 are used by adjusting so that the contents of the individual color phosphors in the phosphor layer relative to the total amount of phosphors become 1 to 10 wt % for the green phosphor, 40 to 80 wt % for the blue phosphor, and 10 to 50 wt % for the red phosphor.

The more preferable blending amount of the above-described individual phosphors is 2 to 9 wt % for the green phosphor, 45 to 65 wt % for the blue phosphor, and 22 to 48 wt % for the red phosphor. When the blending ratio of the individual phosphors in the white LED is not in the above-described relation, a desired white point cannot be realized even if the white LED is used as the backlight for the liquid crystal display device.

It is also effective to increase the average particle diameters of the individual phosphors in order to increase the brightness. It is preferable that the average particle diameter is 1 μm or more, and further is 10 μm or more. As a method of increasing the average particle diameter, there are a method of producing particles of one-color phosphors mutually, a method of producing particles by mixing three color phosphors, and the like. There are also other methods such as a method of using a calcining aid when the phosphor is calcined, and a method of calcining at a high temperature for a long time. The average particle diameter is not limited to a particular upper limit value, and it is preferably 90% or less of the thickness of the phosphor layer of the white LED. If it is larger than the thickness of the phosphor layer, a defect that the phosphor particles drop tends to occur when the phosphor layer is formed by hardening the phosphor particles with resin.

The white LED production method is not limited. For example, the phosphor layer is produced by using a mixture phosphor having the above-described three color phosphors blended with the resin. As a method of producing the mixture phosphor, there are a method of producing the mixture phosphor by mixing phosphor powders of individual colors with the resin and mixing the mixture with the individual color resins, and a method of producing a mixture phosphor by mixing phosphor powders of individual colors in advance and mixing with resin.

A blending ratio of the resin and the phosphors in the mixture phosphor is not limited if it is in a range that the phosphor acts efficiently when the white LED is produced. A total blending amount of the three color phosphors in the entire mixture phosphor, namely in the entire phosphor layer, is blended preferably in 30 to 80 wt %, and more preferably in 40 to 70 wt %. When the blending amount of the phosphors in the phosphor layer is less than 30 wt %, the direct light from the light-emitting diode occasionally comes out without being absorbed by the phosphor layer, and the viscosity of a slurry lowers, so that the phosphor particles sediment easily and color variations might increase. When the blending amount exceeds 80 wt %, the viscosity of the slurry becomes high, and its handling might become difficult.

The resin material used for the above-described mixture phosphor is not limited if it is a resin normally used for the white LED production. It is preferable that the resin is colorless and transparent, and has a prescribed light refractive index. It is preferable that a transmission rate (using a value obtained by measuring monochromatic light of 400 nm by using a test specimen having a thickness of 2 mm) of the resin is 98 to 100%, and particularly 99 to 100%, and the light refractive index of the resin is 1.3 to 1.7, and particularly 1.4 to 1.6. When the light refractive index is less than 1.3, it might become difficult to take light out of the light-emitting diode element, and when it exceeds 1.7, it is not preferable because alteration tends to occur in reaction with ultraviolet rays used to excite the phosphor.

Examples of a preferable resin material satisfying the above conditions are silicone resin and epoxy resin. The silicone resin is more preferable because it is not easily discolored by ultraviolet rays and has durability.

The white LED can be formed by coating the mixture phosphor produced by using the above-described materials on the light-emitting diode and hardening the resin. The structures of a substrate, metallic frame (reflector) and the like used for the white LED are arbitrary.

The above-described white LED provides white light having high brightness. The white LED is used particularly effectively as a backlight of the liquid crystal display device conforming to the EBU standard.

FIG. 3 shows an example that the emitted light of the white LED (specifically, the white LED obtained by Example 1 described below) according to a preferable embodiment is passed through the blue, green and red color filters for the liquid crystal display device, and its emission colors are plotted on a CIE chromaticity diagram. This chromaticity diagram shows that the liquid crystal display device can express the light having chromaticity within a triangle obtained by connecting blue, green and red light emitting points. FIG. 3 also shows the color reproduction range determined according to the EBU standard, and it has substantially the same range as the color reproduction range of the white LED. The color reproduction range determined according to the NTSC standard is also shown for reference in FIG. 3.

The emitted light of the white LED obtained as described above is passed through the blue, greed and red color filters for the liquid crystal display device, and the emission colors are plotted on the CIE chromaticity diagram. Although there are some differences depending on the used color filters, white chromaticity is roughly in a range of $0.20 \leq x \leq 0.36$ and $0.20 \leq y \leq 0.36$, and the individual light emitting points of blue, green and red are within the range given below and plotted in a range including roughly the EBU standard and the NTSC standard.

Blue light emitting point (B): $0.13 \leq x \leq 0.16$, $0.06 \leq y \leq 0.10$
Green light emitting point (G): $0.21 \leq x \leq 0.30$, $0.59 \leq y \leq 0.71$
Red light emitting point (R): $0.63 \leq x \leq 0.68$, $0.32 \leq y \leq 0.34$ The color reproduction range obtained by connecting the above B, G and R as corners of a triangle is same as the color reproduction range determined according to the EBU standard similar to the one shown in FIG. 3.

Thus, the white LED of the embodiment realizes the color reproducibility of the EBU standard by combination with the blue, green and red color filters for the liquid crystal display device conforming to the EBU standard.

The backlight formed by using the above white LED is used for the liquid crystal display device conforming to the EBU standard. To apply the white LED to the backlight, plural white LEDs are used if necessary. The white LED has high brightness, so that it can also be applied to both of sidelight type and directly-under type backlights.

The liquid crystal display device, which is configured by combining the above-described backlight with the blue, green and red color filters for a liquid crystal display device conforming to the EBU standard, conforms to the EBU standard, and it can be used instead of the CRT displays used for broadcasting, video creation and the like.

Other structures of the backlight using the white LED of the embodiment and the liquid crystal display device conforming to the EBU standard can be determined arbitrarily depending to various usages and purposes.

Examples 1 to 6

To evaluate the white LED of the examples, the structure having the cross section of FIG. 1 was used. The white LEDs according to the individual examples were formed by arranging an ultraviolet light-emitting diode having a size of 300 μm square as a light-emitting element, mixing the individual phosphors (70 parts by weight of three color phosphors in total) having an average particle diameter of 5 μm and 30 parts by weight of silicone resin to obtain a slurry, dripping the slurry onto the ultraviolet light-emitting diode, and thermally treating at 100 to 150° C. to harden the silicone resin. The used silicone resin had a light refractive index of 1.4 after hardening.

Excitation wavelengths of ultraviolet light-emitting diodes and kinds and blending ratios of the individual phosphors (wt % of the individual phosphors when the total amount of phosphors was determined to be 100%) used for the white LED production in the above-described examples were determined as shown in Table 1.

Comparative Examples 1 to 3

The same white LED as in Example 1 was prepared except that the compositions of individual color phosphors were determined different from the above range as shown in Table 1 to obtain the white LEDs according to Comparative Examples 1 and 2. And, as Comparative Example 3, a white LED having a phosphor layer containing only a green phosphor shown in Table 1 was produced in the same way as above by using a blue light-emitting diode as a light-emitting element.

TABLE 1

| | Blue Phosphor | | Green Phosphor | | Red Phosphor | | Excitation |
|---|---|---|---|---|---|---|---|
| | Compound | Blending Amount (wt %) | Compound | Blending Amount (wt %) | Compound | Blending Amount (wt %) | Wavelength of Light-Emitting Element (nm) |
| Example 1 | $(Ba, Eu)_{10}(PO_4)_6 \cdot Cl_2$ | 50 | $(Sr_{1.143}Ba_{0.707}Mg_{0.045}Eu_{0.1}Mn_{0.005})SiO_4$ | 5 | $(La_{0.9}, Eu_{0.1})_2O_2S$ | 45 | 400 |
| Example 2 | $2(Sr, Eu)O \cdot 5Al_2O_3$ | 40 | $(Sr_{1.143}Ba_{0.707}Mg_{0.045}Eu_{0.1}Mn_{0.005})SiO_4$ | 10 | $(Y_{0.9}, Eu_{0.1})_2O_2S$ | 50 | 400 |
| Example 3 | $(Ba, Eu)_{10}(PO_4)_6 \cdot Cl_2$ | 80 | $(Sr_{1.143}Ba_{0.707}Mg_{0.045}Eu_{0.1}Mn_{0.005})SiO_4$ | 9 | $(La_{0.9}, Eu_{0.1})_2O_2S$ | 11 | 400 |
| Example 4 | $(Ba, Eu)_{10}(PO_4)_6 \cdot Cl_2$ | 44 | $(Sr_{1.133}Ba_{0.717}Mg_{0.045}Eu_{0.1}Mn_{0.005})SiO_4$ | 6 | $(La_{0.9}, Eu_{0.1})_2O_2S$ | 50 | 400 |
| Example 5 | $(Ba, Eu)_{10}(PO_4)_6 \cdot Cl_2$ | 75 | $(Sr_{1.343}Ba_{0.507}Mg_{0.045}Eu_{0.1}Mn_{0.005})SiO_4$ | 1 | $(La_{0.9}, Eu_{0.1})_2O_2S$ | 24 | 400 |
| Example 6 | $(Ba, Eu)_{10}(PO_4)_6 \cdot Cl_2$ | 65 | $(Sr_{1.343}Ba_{0.507}Mg_{0.045}Eu_{0.1}Mn_{0.005})SiO_4$ | 10 | $(La_{0.9}, Eu_{0.1})_2O_2S$ | 25 | 400 |
| Comparative Example 1 | $(Ba, Eu)_{10}(PO_4)_6 \cdot Cl_2$ | 70 | $(Sr_{1.363}Ba_{0.487}Mg_{0.045}Eu_{0.1}Mn_{0.005})SiO_4$ | 11 | $(La_{0.9}, Eu_{0.1})_2O_2S$ | 19 | 400 |
| Comparative Example 2 | $(Ba, Eu)_{10}(PO_4)_6 \cdot Cl_2$ | 37 | $(Sr_{0.943}Ba_{0.907}Mg_{0.045}Eu_{0.1}Mn_{0.005})SiO_4$ | 11 | $(La_{0.9}, Eu_{0.1})_2O_2S$ | 52 | 400 |
| Comparative Example 3 | — | — | $(Sr_{1.343}Ba_{0.507}Mg_{0.045}Eu_{0.1}Mn_{0.005})SiO_4$ | 100 | — | — | 462 |

<Evaluation>

Emission spectra of the white LEDs according to Examples and Comparative Examples were measured. Results on wavelengths of the exhibited light emission peaks and intensity ratios of the individual light emission peaks are shown in Table 2. Linear peaks were discriminated by adding (1) to the rear of the unit nm of the wavelength. P1, P2, P3, V1 and 600 nm of the light emission peak intensity are intensities shown below.

P1: Maximum intensity of first light emission peak group (range of 430 to 470 nm)

P2: Maximum intensity of second light emission peak group (range of 520 to 560 nm)

P3: Maximum intensity of third light emission peak group (range of 580 to 740 nm)

V1: Minimum intensity of valley (range of 480 to 500 nm) between first and second light emission peak groups 600 nm: Intensity of wavelength 600 nm And, 600 nm/P3 shows a percentage (%) of the third light emission peak group with intensity of 600 nm to the maximum intensity P3.

TABLE 2

|  | Light Emission Peak Wavelengths in Emission Spectrum (nm) | Intensity Ratio of Emission Peaks | | | 600 nm/P3 (%) |
|---|---|---|---|---|---|
|  |  | P2/P1 | P3/P1 | V1/P1 |  |
| Example 1 | 452 nm, 534 nm, 595 nm(I), 616 nm(I), 625 nm(I), 704 nm(I) | 0.63 | 2.40 | 0.16 | 8 |
| Example 2 | 456 nm, 534 nm, 598 nm(I), 619 nm(I), 628 nm(I), 707 nm(I) | 0.63 | 2.40 | 0.20 | 8 |
| Example 3 | 452 nm, 534 nm, 595 nm(I), 616 nm(I), 625 nm(I), 704 nm(I) | 0.70 | 0.20 | 0.20 | 50 |
| Example 4 | 452 nm, 520 nm, 595 nm(I), 616 nm(I), 625 nm(I), 704 nm(I) | 1.00 | 3.00 | 0.60 | 5 |
| Example 5 | 452 nm, 560 nm, 595 nm(I), 616 nm(I), 625 nm(I), 704 nm(I) | 0.10 | 0.20 | 0.01 | 5 |
| Example 6 | 452 nm, 560 nm, 595 nm(I), 616 nm(I), 625 nm(I), 704 nm(I) | 1.00 | 0.70 | 0.02 | 50 |
| Comparative Example 1 | 452 nm, 565 nm, 595 nm(I), 616 nm(I), 625 nm(I), 704 nm(I) | 0.10 | 0.10 | 0.01 | 52 |
| Comparative Example 2 | 452 nm, 515 nm, 595 nm(I), 616 nm(I), 625 nm(I), 704 nm(I) | 1.10 | 3.10 | 0.70 | 3 |
| Comparative Example 3 | 462 nm(by light-emitting element), 560 nm | 0.45 | — | 0.21 | — |

It is seen that the light emission peaks of the emission spectrum of the white LED of Example is substantially similar to the emission spectrum of the CRT shown in FIG. 2. Meanwhile, the blending amount of phosphors of the white LEDs of Comparative Examples is not adjusted to fall in the above range, so that the maximum intensity of the first light emission peak group becomes small in Comparative Example 1, the wavelength of the second light emission peak becomes short in Comparative Example 2, and a difference from the emission spectrum of the CRT is large as a result. In addition, since Comparative Example 3 does not have the third light emission peak group, an index related to the P3 cannot be defined, and it is not in the above range.

Examples 7 to 11, Comparative Examples 4 to 6

The white LEDs of Examples 1 and 3 to 6 and Comparative Examples 1 to 3 were used to configure backlights for the liquid crystal display device conforming to the EBU standard by combining with the color filter generally used for industrial use.

The light which was passed through the color filter was led to an integrating sphere, the emission colors of red (R), green (G) and blue (B) were evaluated, and the color reproduction range (color reproducibility) on a liquid crystal display devices (displays) was examined. As to the color reproducibility, the CIE chromaticity diagram shown in FIG. 3 was used to measure coordinates of green, blue and red light emitting points. In addition, white chromaticity was determined. For comparison, white chromaticity and the light emission coordinates of the individual colors of lights emitted in the GBR display state of a CRT RDS-15X (manufactured by Mitsubishi Electric Corporation) were examined. The results are shown in Table 3.

TABLE 3

|  |  | Green Chromaticity | | Blue Chromaticity | | Red Chromaticity | | White Chromaticity | |
|---|---|---|---|---|---|---|---|---|---|
| Backlight | White LED | x-coordinate | y-coordinate | x-coordinate | y-coordinate | x-coordinate | y-coordinate | x-coordinate | y-coordinate |
| Example 7 | Example 1 | 0.27 | 0.64 | 0.14 | 0.09 | 0.64 | 0.33 | 0.30 | 0.32 |
| Example 8 | Example 3 | 0.27 | 0.64 | 0.14 | 0.09 | 0.63 | 0.34 | 0.20 | 0.36 |
| Example 9 | Example 4 | 0.21 | 0.71 | 0.16 | 0.10 | 0.68 | 0.32 | 0.23 | 0.22 |
| Example 10 | Example 5 | 0.29 | 0.60 | 0.13 | 0.06 | 0.63 | 0.33 | 0.25 | 0.20 |
| Example 11 | Example 6 | 0.30 | 0.68 | 0.13 | 0.07 | 0.63 | 0.34 | 0.26 | 0.24 |
| Comparative Example 4 | Comparative Example 1 | 0.31 | 0.67 | 0.13 | 0.06 | 0.62 | 0.35 | 0.30 | 0.32 |
| Comparative Example 5 | Comparative Example 2 | 0.21 | 0.71 | 0.18 | 0.11 | 0.68 | 0.32 | 0.36 | 0.36 |
| Comparative Example 6 | Comparative Example 3 | 0.31 | 0.58 | 0.14 | 0.07 | 0.63 | 0.35 | 0.18 | 0.33 |
| CRT | — | 0.29 | 0.60 | 0.15 | 0.07 | 0.64 | 0.33 | — | — |

As shown in Table 3, it was found that the liquid crystal display devices (backlights) according to the Example have color reproducibility conforming to the EBU standard similar to the case of using the conventional CRT. Meanwhile, in Comparative Examples, it was hard to say that they have color reproducibility conforming to the EBU standard because at least one color of green chromaticity, blue chromaticity and red chromaticity is deviated from chromaticity when the conventional CRT is used.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A white LED for a backlight of a liquid crystal display device, comprising:
   a light-emitting element including at least one selected from an ultraviolet light-emitting diode, a purple light-emitting diode, an ultraviolet light-emitting laser, and a purple light-emitting laser, and having a light emission wavelength in a range of 360 to 430 nm; and
   a phosphor layer containing a green phosphor, a blue phosphor, and a red phosphor,
   wherein an emission spectrum of the white LED comprises:
      a first light emission peak group including at least one light emission peak having a maximum intensity in a range of 430 to 470 nm;
      a second light emission peak group including at least one light emission peak having a maximum intensity in a range of 520 to 560 nm;
      a third light emission peak group including two or more linear light emission peaks in a range of 580 to 740 nm; and
      a valley which is between the first light emission peak group and the second light emission peak group and has a minimum intensity in a range of 480 to 500 nm,
   wherein, in case that the first light emission peak group is determined to have a maximum intensity P1 of 1.0, a maximum intensity P2 of the second light emission peak group is $0.1 \leq P2 \leq 1.0$; a maximum intensity P3 of the third light emission peak group is $0.2 \leq P3 < 3.0$; and a minimum intensity V1 of the valley is $0.01 \leq V1 \leq 0.6$,
   wherein an intensity of 600 nm is 50% or less of the maximum intensity P3 of the third light emission peak group, and
   wherein a content of the green phosphor in the phosphor layer relative to the total amount of the phosphors is in a range of 1 to 10 wt %, a content of the blue phosphor in the phosphor layer relative to the total amount of the phosphors is in a range of 40 to 80 wt %, and a content of the red phosphor in the phosphor layer relative to the total amount of the phosphors is in a range of 10 to 50 wt %.

2. The white LED according to claim 1,
   wherein the green phosphor includes a divalent europium-activated silicate phosphor represented by a general formula:

$(Sr_{2-x-y-z-u}Ba_xMg_yEu_zMn_u)SiO_4$ where, x, y, z and u are values satisfying $0.1 < x < 1.0$, $0 \leq y < 0.21$, $0.05 < z < 0.3$ and $0 \leq u < 0.04$.

3. The white LED according to claim 1,
   wherein the blue phosphor includes at least one selected from:
   a divalent europium-activated halo-phosphate phosphor represented by a general formula:

$(M2,Eu)_{10}(PO_4)_6 \cdot Cl_2$ where, M2 is at least one element selected from Mg, Ca, Sr and Ba; and
   a divalent europium-activated aluminate phosphor represented by a general formula:

$a(M3,Eu)O \cdot bAl_2O_3$ where, M3 is at least one element selected from Mg, Ca, Sr, Ba, Zn, Li, Rb and Cs, and a and b are values satisfying $0 < a$, $0 < b$ and $0.2 \leq a/b \leq 1.5$.

4. The white LED according to claim 1,
   wherein the red phosphor includes at least one selected from:
   a europium-activated lanthanum oxysulfide phosphor expressed by a general formula:

$(La_{1-x1},Eu_{x1})_2O_2S$ where, x1 is a value satisfying $0.01 < x1 < 0.15$; and
   a europium-activated yttrium oxysulfide phosphor expressed by a general formula:

$(Y_{1-x2},Eu_{x2})_2O_2S$ where, x2 is a value satisfying $0.01 < x2 < 0.15$.

5. A backlight for a liquid crystal display device comprising the white LED according to claim 1.

6. A liquid crystal display device comprising the backlight according to claim 5.

7. The white LED according to claim 1,
   wherein the light emission peak in the second light emission peak group has the maximum intensity in a range of 520 to 555 nm.

8. The white LED according to claim 1,
   wherein the third light emission peak group includes at least one of first linear light emission peak exhibited in a range of 620 to 630 nm and a second linear light emission peak exhibited in a range of 700 to 710 nm.

9. The white LED according to claim 1,
   wherein the content of the green phosphor is in a range of 2 to 9 wt %, the content of the blue phosphor is in a range of 45 to 65 wt %, and the content of the red phosphor is in a range of 22 to 48 wt %.

* * * * *